United States Patent
Huang et al.

(10) Patent No.: US 12,255,217 B2
(45) Date of Patent: Mar. 18, 2025

(54) SEMICONDUCTOR DEVICE, SEMICONDUCTOR IMAGE SENSOR, AND METHOD OF MANUFACTURING THE SAME

(71) Applicant: TAIWAN SEMICONDUCTOR MANUFACTURING COMPANY, LTD., Hsinchu (TW)

(72) Inventors: Li-Wen Huang, Hsinchu (TW); Chun-Lin Fang, Hsinchu (TW); Kuan-Ling Pan, Hsinchu (TW); Ping-Hao Lin, Hsinchu (TW); Kuo-Cheng Lee, Hsinchu (TW); Cheng-Ming Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 335 days.

(21) Appl. No.: 17/220,212

(22) Filed: Apr. 1, 2021

(65) Prior Publication Data

US 2022/0020787 A1    Jan. 20, 2022

Related U.S. Application Data

(60) Provisional application No. 63/053,094, filed on Jul. 17, 2020.

(51) Int. Cl.
*H01L 27/146* (2006.01)

(52) U.S. Cl.
CPC .... *H01L 27/1463* (2013.01); *H01L 27/14629* (2013.01); *H01L 27/14645* (2013.01); *H01L 27/14685* (2013.01); *H01L 27/14689* (2013.01)

(58) Field of Classification Search
CPC .......... H01L 27/1463; H01L 27/14629; H01L 27/14645; H01L 27/14685
See application file for complete search history.

(56) References Cited

U.S. PATENT DOCUMENTS

2007/0001100 A1    1/2007  Hsu et al.
2015/0333099 A1*  11/2015  Lyu ................... H01L 27/14641
                                                           257/432

(Continued)

FOREIGN PATENT DOCUMENTS

JP        2018190946        11/2018
JP        2019510365         4/2019

(Continued)

OTHER PUBLICATIONS

Office Action dated Jul. 11, 2022 for corresponding case No. TW 11120680790. (pp. 1-9).

*Primary Examiner* — Mounir S Amer
*Assistant Examiner* — Alexander Belousov
(74) *Attorney, Agent, or Firm* — Hauptman Ham, LLP

(57) ABSTRACT

A semiconductor device includes a first type of light sensing units, where each instance of the first type of light sensing units is operable to receive a first amount of radiation; and a second type of light sensing units, where each instance of the second type of light sensing units is operable to receive a second amount of radiation, and the second type of light sensing units is arranged in an array with the first type of light sensing units to form a pixel sensor. The first amount of radiation is smaller than the second amount of radiation, and at least a first instance of the first type of light sensing units is adjacent to a second instance first type of light sensing unit.

20 Claims, 10 Drawing Sheets

(56) References Cited

U.S. PATENT DOCUMENTS

| | | | |
|---|---|---|---|
| 2018/0295295 A1 | 10/2018 | Hicks et al. | |
| 2018/0315788 A1* | 11/2018 | Kuo | G02B 5/288 |
| 2018/0366513 A1* | 12/2018 | Yang | H01L 27/14868 |
| 2019/0131333 A1 | 5/2019 | Borthakur et al. | |
| 2020/0350346 A1* | 11/2020 | Ohura | H01L 21/76 |

FOREIGN PATENT DOCUMENTS

| | | |
|---|---|---|
| TW | 200949397 | 12/2009 |
| TW | 202013697 | 4/2020 |
| WO | 2017/121630 | 7/2017 |

\* cited by examiner

SEMICONDUCTOR DEVICE, SEMICONDUCTOR IMAGE SENSOR, AND METHOD OF MANUFACTURING THE SAME

PRIORITY CLAIM

This application claims the priority of U.S. Provisional Application No. 63/053,094, filed Jul. 17, 2020, which is incorporated herein by reference in its entirety.

BACKGROUND

Semiconductor image sensors are used for sensing light. The semiconductor image sensors utilize an array of pixels in a substrate, including photodiodes and transistors that can absorb radiation projected toward the substrate and convert the sensed radiation into electrical signals.

A performance of a semiconductor image sensor depends on, among other things, its quantum efficiency and optical crosstalk. The quantum efficiency of an image sensor indicates a number of electrons generated per number of incident photons in the image sensor. The optical crosstalk occurs when some photons incident upon a pixel are absorbed by another pixel.

Therefore, while existing semiconductor structures of image sensors and conventional methods of manufacturing image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
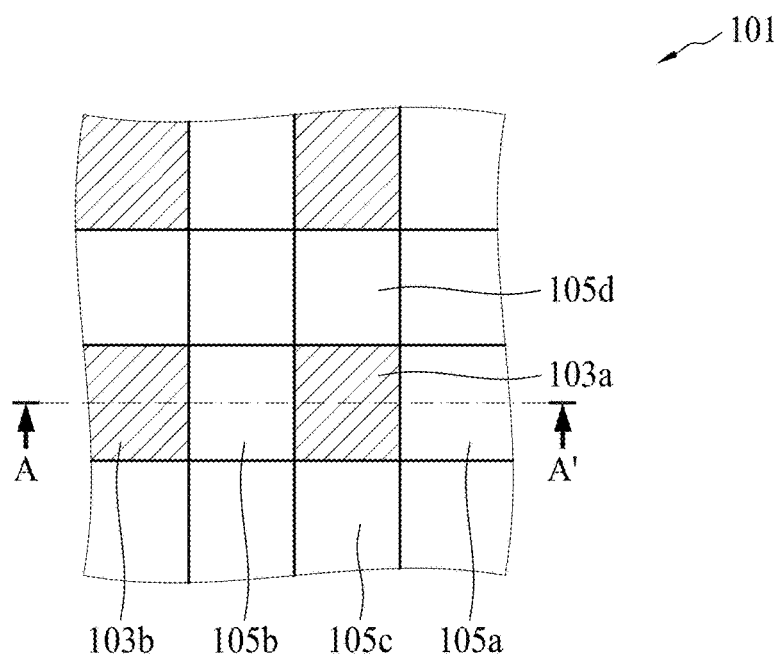
FIG. 1(a) illustrates a top view of a semiconductor device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Some embodiments of image sensors use at least two kinds of pixel sensors, classified by the incident radiation, forming a repeating unit arranged in an array. For example, some embodiments of an image sensor include a first pixel sensor for sensing long wavelengths (e.g., infrared (IR) and red light) and a second pixel sensor for sensing short wavelengths (e.g., green and blue light). In addition, in some embodiments, each of the pixel sensors further use at least two kinds of light sensing units, classified by the amount of the incident radiation (or light) to be received. For example, as used herein, a first light sensing unit refers to a light sensing unit that is operable to receive less radiation (or light) compared to a second light sensing unit given a certain period of time.

As the size of an image sensor gets smaller, crosstalk becomes a major concern between neighboring pixel sensors and further the neighboring light sensing units contained in the neighboring pixel sensors. As the surface area for receiving light becomes smaller, the light sensing unit becomes more sensitive to crosstalk because the signal (light directly received by the sensor) is smaller in comparison to the noise (the crosstalk between neighboring pixel sensors). Crosstalk adversely affects the amount of the light that is received by the light sensing unit. Pixel sensor designs which reduce crosstalk provide increased light absorption efficiency, especially beneficial for low levels of incident light.

Figure 1B:
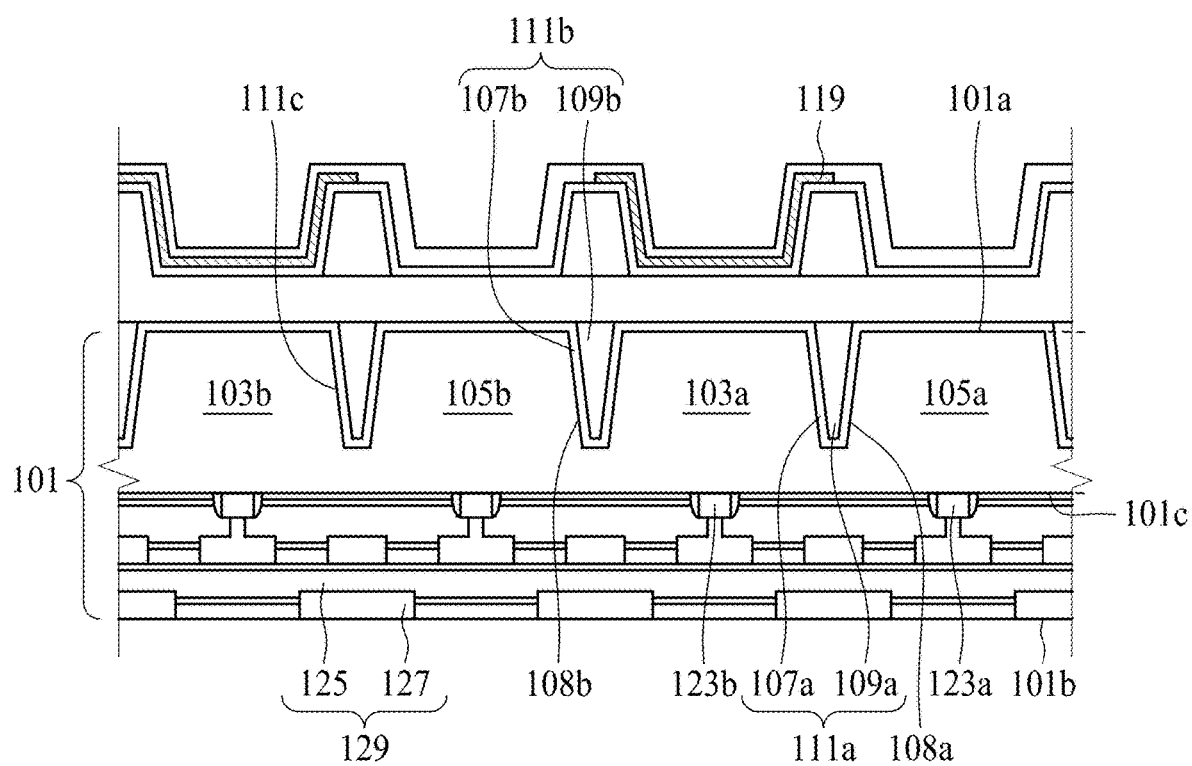
FIG. 1(b) illustrates a cross-sectional view taken along line A-A' of the semiconductor device in FIG. 1(a).

FIG. 1(a) illustrates a top view of a semiconductor device 101 according to some embodiments of the present disclosure. FIG. 1(b) illustrates a cross-sectional view taken along line A-A' of the semiconductor device 101 in FIG. 1(a).

The semiconductor device 101 of FIG. 1(a) includes a plurality of first light sensing units 103a, 103b and a plurality of second light sensing units 105a, 105b, 105c, 105d.

The semiconductor device 101 has a first surface 101a and a second surface 101b opposite to the first surface 101a. According to some embodiments, semiconductor device 101 is a bulk semiconductor substrate (e.g., a bulk silicon (Si) substrate), a silicon-on-insulator (SOI) substrate, or a wafer. In some embodiments, the semiconductor device 101 is a wafer.

The first light sensing unit 103a, 103b is operable to receive a radiation projected toward the first light sensing unit 103a, 103b and convert the radiation to electrical signal. In some embodiments, the first light sensing unit 103a, 103b is operable to detect different wavelengths (colors) from an incident light (e.g., blue (B), green (G), and red (R) light). According to some embodiments, the first light sensing unit 103a, 103b is a component or a part of a pixel sensor. In some embodiments, the first light sensing unit 103a, 103b is arranged in a sub-array in a pixel sensor.

The second light sensing unit 105a, 105b, 105c, 105d is operable to receive a radiation projected toward the second light sensing unit 105a, 105b, 105c, 105d and convert the radiation to electrical signal. In some embodiments, the second light sensing unit 105a, 105b, 105c, 105d is operable to detect different wavelengths (colors) from an incident light (e.g., blue (B), green (G), and red (R) light). As used herein, the second light sensing unit 105a, 105b, 105c, 105d refers to a light sensing unit that is operable to receive more radiation than a first light sensing unit 103a, 103b. In other words, the first light sensing unit 103a, 103b refers to a light sensing unit that is operable to receive less radiation than a second light sensing unit 105a, 105b, 105c, 105d. In some embodiments, the first light sensing unit 103a, 103b is operable to receive less radiation by disposing a reflective layer 119 above the first light sensing unit 103a, 103b. In some embodiments, the second light sensing unit 105a, 105b, 105c, 105d is also a component or a part of a pixel sensor. According to some embodiments, the second light sensing unit 105a, 105b, 105c, 105d is arranged in a sub-array with the first light sensing unit 103a, 103b in a pixel sensor.

The first light sensing unit 103a, 103b and the second light sensing unit 105a, 105b, 105c, 105d constitute a pixel sensor. According to some embodiments, a pixel sensor includes at least one first light sensing unit 103a, 103b and at least one second light sensing unit 105a, 105b, 105c, 105d. In some embodiments, the first light sensing unit 103a, 103b is disposed adjacent to at least two second light sensing units 105a, 105b, 105c, 105d. In some embodiments, the first light sensing unit 103a, 103b is disposed adjacent to two, three, four, five, six, seven, or eight second light sensing units 105a, 105b, 105c, 105d. In some embodiments, the first light sensing unit 103a, 103b is surrounded by the second light sensing unit 105a, 105b, 105c, 105d around a periphery of the first light sensing unit 103a, 103b. In some embodiments, the second light sensing units 105a, 105b, 105c, 105d is a circular region surrounded by the first light sensing units 103a, 103b. According to some embodiments, the first light sensing unit 103a, 103b is surrounded by at least two second light sensing units 105a, 105b, 105c, 105d in a pixel sensor. In some embodiments, a first light sensing unit 103a, 103b is surrounded by three second light sensing units 105a, 105b, 105c, which constitute a repeating pixel sensor unit. In some embodiments, a repeating pixel sensor unit includes a first light sensing unit 103a, 103b surrounded by four second light sensing units 105a, 105b, 105c, 105d.

According to some embodiments, a pixel sensor composed of the first light sensing unit 103a and the second light sensing units 105a, 105b, 105c, 105d is one of a blue light sensor, a green light sensor, and a red light sensor.

According to some embodiments, a first isolation structure 111a, 111b, 111c is further disposed between the first light sensing unit 103a, 103b and the neighboring second light sensing unit 105a, 105b so the light projected toward to the second light sensing unit 105a, 105b is blocked and does not reach the first light sensing unit 103a, 103b. As a result, crosstalk interference from the neighboring second light sensing unit 105a, 105b to the first light sensing unit 103a, 103b is reduced. According to some embodiments, the first isolation structure 111a, 111b, 111c has a substantially rectangular shape, a trapezoidal shape, an elongated elliptical shape, or any other suitable shape. In some embodiments, the first isolation structure 111a, 111b, 111c includes a liner 107a, 107b and an insulating structure 109a, 109b.

The liner 107a, 107b is disposed in conformity with a trench 108a, 108b disposed adjacent to the first surface 101a of the semiconductor device 101.

In some embodiments, the liner 107a, 107b includes a low-refractive index (low-n) material which has a refractive index (n) less than a color filter operable for the first light sensing unit 103a, a high-k (high dielectric constant) material, or a combination thereof. In some embodiments, the low-n material includes, for example, $SiO_2$, $HfO_2$, or a combination thereof. In some embodiments, the high-k material includes, for example, $HfO_2$, $Al_2O_3$, $TiO_2$, HfZrO, $Ta_2O_3$, $Ta_2O_5$, $HfSiO_4$, $ZrO_2$, $ZrSiO_2$, $Ln_2O_3$, or a combination thereof.

The insulating structure 109a, 109b is disposed adjacent to the liner 107a, 107b. In some embodiments, the insulating structure 109a, 109b is disposed on the liner 107a, 107b. In some embodiments, the insulating structure 109a, 109b includes a low-n material, which has a refractive index (n) less than a color filter operable for the first light sensing unit 103a. In some embodiments, the low-n material includes, for example, $SiO_2$, $HfO_2$, or a combination thereof. In some embodiments, the insulating structure 109a, 109b also includes a low-k material (e.g., a glass material composed of fluorine, silicon, and oxygen), an oxide layer, and a reflective material to prevent the radiation projected toward one side of the insulation structure 109a, 109b from entering another side of the insulation structure 109a, 109b to further reduce the crosstalk between the first light sensing unit 103a, 103b and the second light sensing unit 105a, 105b.

A logic device 123a, 123b, such as a transistor, is further disposed in the semiconductor device 101 and operable to enable readout of the first light sensing unit 103a, 103b, the second light sensing unit 105a, 105b, 105c, 105d, or both. In some embodiments, the logic device 123a, 123b is disposed adjacent to the first light sensing unit 103a, 103b, the second light sensing unit 105a, 105b, 105c, 105d, or both. In some embodiments, the logic device 123a, 123b is disposed adjacent to a third surface 101c opposite to the first surface 101a of the semiconductor device 101 and close to the back end of the first light sensing unit 103a, 103b and the second light sensing unit 105a, 105b, 105c, 105d.

According to some embodiments, the circuit stack 129 is further disposed adjacent to the logic device 123a, 123b. In some embodiments, circuit stack 129 is disposed adjacent to the second surface 101b of the semiconductor device 101. In some embodiments, circuit stack 129 is a back-end-of-line (BEOL) metallization stack. In some embodiments, circuit stack 129 electrically connects to the logic device 123a, 123b through at least one conductive via, at least one conductive contact, or a combination thereof. In some embodiments, circuit stack 129 includes at least one metal layer 127 and at least one dielectric layer 125.

The metal layer 127 is disposed in the dielectric layer 125. In some embodiments, the metal layer 127 includes, for example, copper, tungsten, aluminum, other metals, or a metal alloy thereof.

According to some embodiments, dielectric layer 125 includes a low-k material (e.g., a dielectric material having a dielectric constant less than 3.9).

Figure 2A:
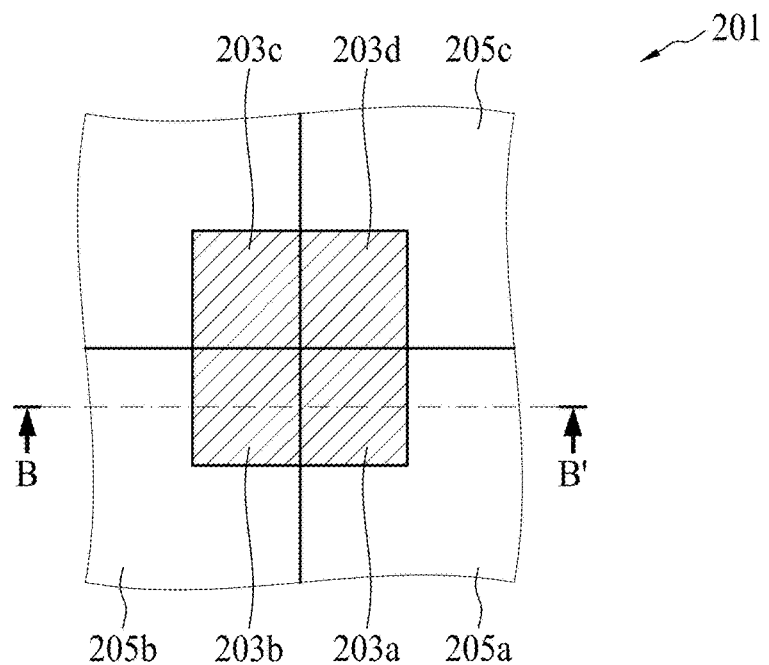
FIG. 2(a) illustrates a top view of a semiconductor device according to some embodiments of the present disclosure.
Figure 2B:
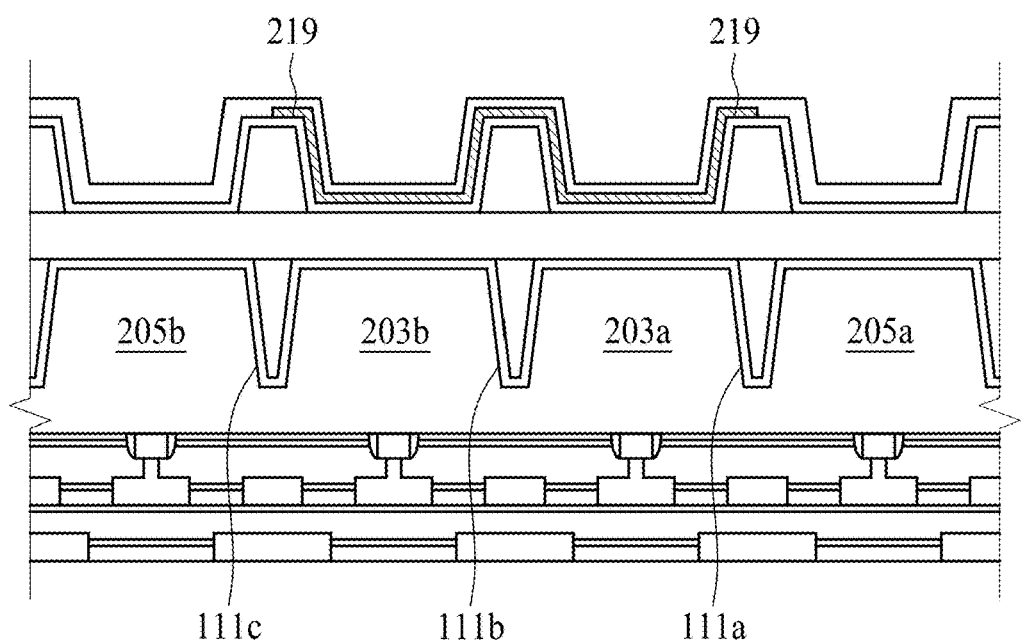
FIG. 2(b) illustrates a cross-sectional view taken along line B-B' of the semiconductor device in FIG. 2(a).

FIG. 2(a) illustrates a top view of a semiconductor device 201 according to some embodiments of the present disclosure. The semiconductor device 201 illustrated in FIG. 2(a) is similar to that illustrated in FIG. 1(a) with a difference including that at least a portion of a first light sensing units 203a is adjacent to at least one first light sensing unit 203b, 203c, 203d. FIG. 2(b) illustrates a cross-sectional view taken along line B-B' of the semiconductor device 201 in FIG. 2(a).

Unlike the semiconductor device 101 illustrated in FIG. 1(a) and FIG. 1(b), the semiconductor device 201 illustrated in FIG. 2(a) and FIG. 2(b) includes at least one first light sensing unit 203a disposed adjacent to at least one first light sensing unit 203b, 203c, 203d. In some embodiments, at least one side surface of the first light sensing unit 203a is disposed adjacent to at least one first light sensing unit 203b, 203c, 203d. In some embodiments, at least two side surfaces of the first light sensing unit 203a is disposed adjacent to at least one first light sensing unit 203b, 203c, 203d. In some embodiments, a first instance of a first light sensing unit 203a may be adjoined at a first side by a second instance of the first light sensing unit 203b, and at a second side adjacent to the first side by a third instance of the first light sensing unit 203d. In some embodiments, at least a portion of the first light sensing unit 203a is surrounded by at least one first light sensing unit 203b, 203c, 203d. In some embodiments, at least a portion of the first light sensing unit 203a is surrounded by at least two first light sensing units 203b, 203c. In some embodiments, at least a portion of the first light sensing unit 203a is surrounded by at least three first light sensing units 203b, 203c, 203d.

At least a portion of the first light sensing unit 203a is surrounded by at least a portion of another first light sensing unit 203b, 203c, 203d and at least a portion of the first light sensing unit 203a is surrounded by at least a portion of a second light sensing unit 205a. In some embodiments, at least a portion of the first light sensing unit 203a is surrounded by at least a portion of another first light sensing unit 203b, 203c, 203d and the rest portions of the first light sensing unit 203a is surrounded by at least a portion of a second light sensing unit 205a.

In some embodiments, the first light sensing unit 203a and the second light sensing unit 205a constitute a pixel sensor. According to some embodiments, a pixel sensor includes at least one first light sensing unit 203a and at least one second light sensing unit 205a. In some embodiments, the first light sensing unit 203a is adjacent to at least one second light sensing unit 205a. In some embodiments, the first light sensing unit 203a is disposed adjacent to one, two, three, four, or five second light sensing units 205a, 205b, 205c. In some embodiments, the first light sensing unit 203a is surrounded by the second light sensing unit 205a, 205b, 205c partially. In some embodiments, first light sensing unit 203a is surrounded by at least one second light sensing unit 205a in a pixel sensor. In some embodiments, a repeating pixel sensor unit includes a first light sensing unit 203a surrounded by a second light sensing unit 205a. In some embodiments, the first light sensing unit 203a is disposed adjacent to a corner of a pixel sensor. In some embodiments, the first light sensing unit 203a is located at a corner of a pixel sensor. In some embodiments, a projection area of the first light sensing unit 203a, 203b to the projection area of the second light sensing unit 205a, 205b is about 1:3.

In some embodiments, a first light sensing unit 203a is surrounded by one second light sensing units 205a of the same pixel sensor and by another second light sensing unit 205b, 205c of another pixel sensor. In some embodiments, the portion of the first light sensing unit 203a surrounded by the second light sensing units 205a of the same pixel sensor is not greater than the portion of the first light sensing unit 203a surrounded by a first light sensing unit 203b, 203c, 203d.

By disposing at least a portion of a first light sensing units 203a adjacent to at least one first light sensing unit 203b, the crosstalk occurred due to the reflection or refraction of the light from the neighboring second light sensing unit 205a to the first light sensing units 203a is reduced as the area of the second light sensing unit 205b surrounding the first light sensing unit 203a is reduced. As a result, since the light interference (e.g., crosstalk) from the neighboring second light sensing unit 205a, 205b is reduced, the light sensitivity of the first light sensing units 203a, 203b increases.

Referring to FIG. 2(b), in some embodiments where a first light sensing unit 203a is disposed adjacent to another first light sensing unit 203b, the reflective layer 219 extends from a projection area of the first light sensing unit 203a to a projection area of the first light sensing unit 203b.

Figure 3A:
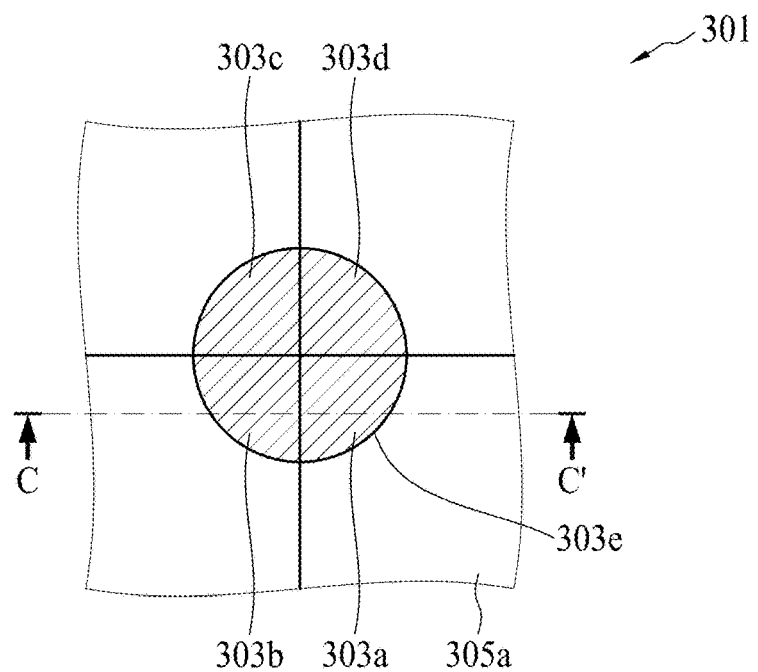
FIG. 3(a) illustrates a top view of a semiconductor device according to some embodiments of the present disclosure.

FIG. 3(a) illustrates a top view of a semiconductor device 301 according to some embodiments of the present disclosure. The semiconductor device 301 illustrated in FIG. 3(a) is similar to that illustrated in FIG. 2(a) with a difference including that a side surface 303e of the first light sensing unit 303a is curved by which the portion of the first light sensing unit 303a surrounded by the second light sensing units 305a of the same pixel sensor may be further reduced compared to that illustrated in FIG. 2(a). In some embodiments, the portion of the first light sensing unit 303a surrounded by the second light sensing units 305a of the same pixel sensor is smaller than the portion of the first light sensing unit 303a surrounded by a first light sensing unit 303b, 303c, 303d. As a result, since the portion of the first light sensing unit 303a surrounded by the second light sensing units 305a of the same pixel sensor may be further reduced, the crosstalk interference mentioned above is further reduced compared to that illustrated in FIG. 2(a).

Figure 3B:
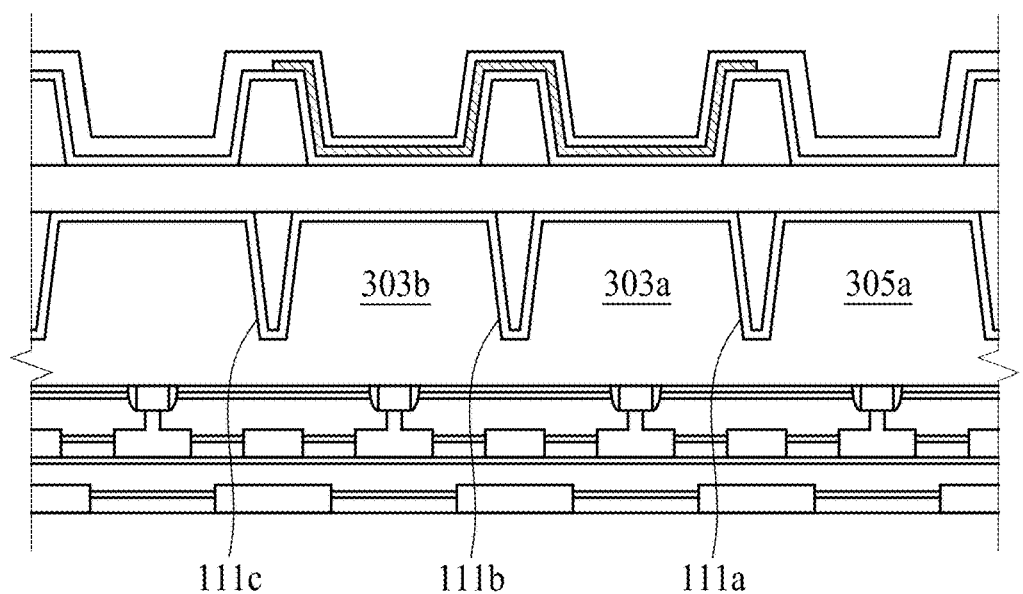
FIG. 3(b) illustrates a cross-sectional view taken along line C-C' of the semiconductor device in FIG. 3(a).

FIG. 3(b) illustrates a cross-sectional view taken along line C-C' of the semiconductor device 301 in FIG. 3(a). The structure of the semiconductor device 301 illustrated in FIG. 3(b) is similar to that illustrated in FIG. 2(b), which are not further described for brevity.

Figure 4A:
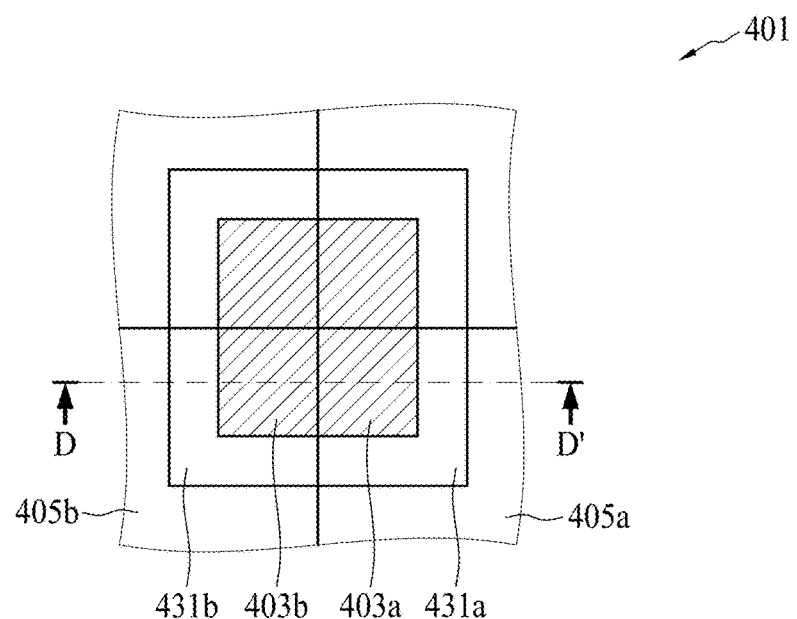
FIG. 4(a) illustrates a top view of a semiconductor device according to some embodiments of the present disclosure.
Figure 4B:
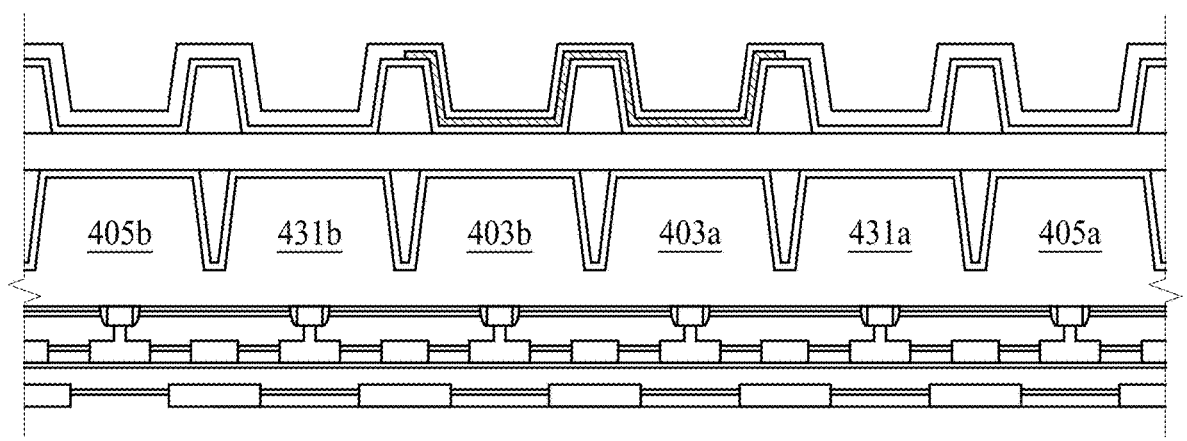
FIG. 4(b) illustrates a cross-sectional view taken along line D-D' of the semiconductor device in FIG. 4(a).

FIG. 4(a) illustrates a top view of a semiconductor device 401 according to some embodiments of the present disclosure. The semiconductor device 401 illustrated in FIG. 4(a) is similar to that illustrated in FIG. 2(a) with a difference including that an third light sensing unit 431a, 431b is disposed between the first light sensing unit 403a, 403b and the second light sensing unit 405a, 405b. FIG. 4(b) illustrates a cross-sectional view taken along line D-D' of the semiconductor device 401 in FIG. 4(a).

In some embodiments, the third light sensing unit 431a, 431b is different from the first light sensing unit 403a, 403b and the second light sensing unit 405a, 405b so the third light sensing unit 431a, 431b could be distinguished from the first light sensing unit 403a, 403b and not cause a crosstalk as the second light sensing unit 405a, 405b does. In some embodiments, the third light sensing unit 431a, 431b is operable to receive a radiation projected toward the third light sensing unit 431a, 431b and convert the radiation to electrical signal. In some embodiments, the third light sensing unit 431a, 431b is operable to receive less radiation projected toward it than the first light sensing unit 403a, 403b, the second light sensing unit 405a, 405b, or both and convert the radiation to electrical signal. As a result, since the third light sensing unit 431a, 431b may receive less radiation projected toward it than the second light sensing unit 405a, 405b, it may cause less crosstalk than the second light sensing unit 405a, 405b does, which further reduces the crosstalk interference toward the first light sensing unit 403a, 403b compared to a second light sensing unit 405a, 405b.

In addition, since disposing the third light sensing unit 431a, 431b between the first light sensing unit 403a, 403b and the second light sensing unit 405a, 405b may increase the distance between them and make the crosstalk source of the second light sensing unit 405a, 405b to be away from the first light sensing unit 403a, 403b, less crosstalk may reach the first light sensing unit 403a, 403b, which further improves the sensitivity of the first light sensing unit 403a, 403b.

Figure 5:
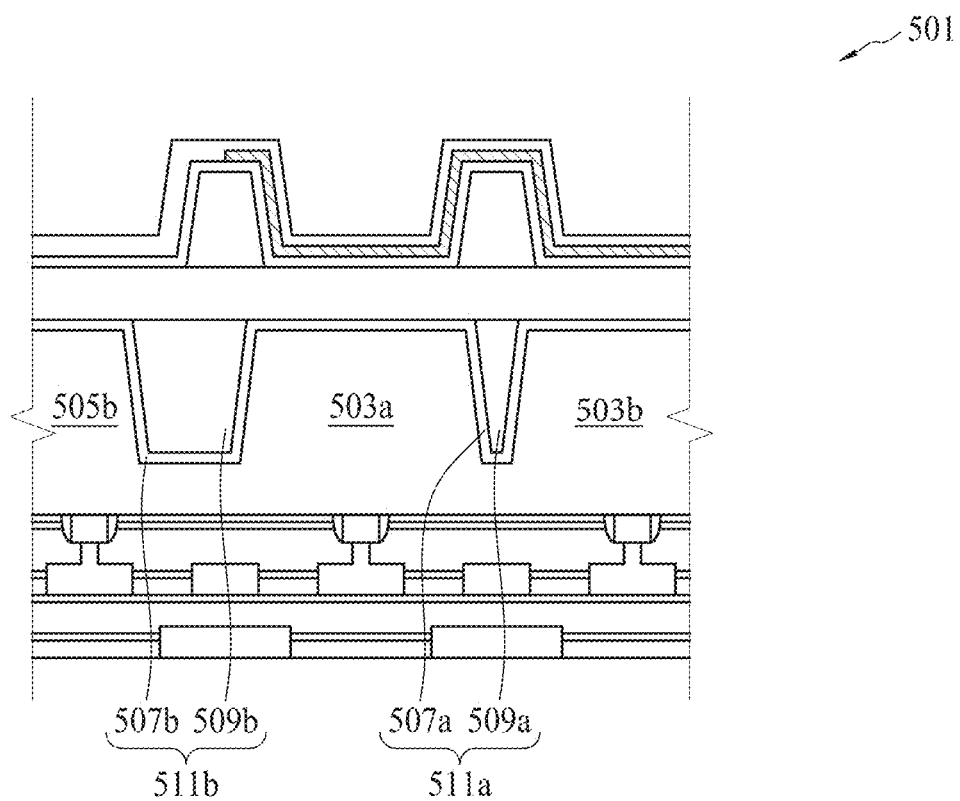
FIG. 5 illustrates a cross-sectional view of a semiconductor device according to some embodiments of the present disclosure.

FIG. 5 illustrates a cross-sectional view of a semiconductor device 501 according to some embodiments of the present disclosure. The semiconductor device 501 illustrated in FIG. 5 is similar to that illustrated in FIG. 1(a), FIG. 2(a), FIG. 3(a), and FIG. 4(a) with a difference including that the first isolation structure 511b has a larger projection area compared to a regular design.

In some embodiments, such as those illustrated in FIG. 5 where the first isolation structure 511b is disposed separating the first light sensing unit 503a from the second light sensing unit 505b, a projection area of the first isolation structure 511b is enlarged compared to a regular design so less crosstalk transmits through it and reaches the first light sensing unit 503a, 503b. As a result, the crosstalk interference from the neighboring second light sensing unit 505b is reduced.

In some embodiments, such as those illustrated in FIG. 5 where a first isolation structure 511b is disposed separating the first light sensing unit 503a from the second light sensing unit 505b and a second isolation structure 511a is disposed separating the first light sensing unit 503a from another first light sensing unit 503b, the crosstalk interference from the neighboring second light sensing unit 505b is reduced by disposing the first isolation structure 511b having a larger projection area than the second isolation structure 511a.

In some embodiments, the first isolation structure 511b includes a liner 507b and an insulating structure 509b. In some embodiments, the second isolation structure 511a includes a liner 507a and an insulating structure 509a. The liners 507b, 507a and the insulation structures 509b, 509a are similar to those described above and are not further described for brevity.

Figure 6:
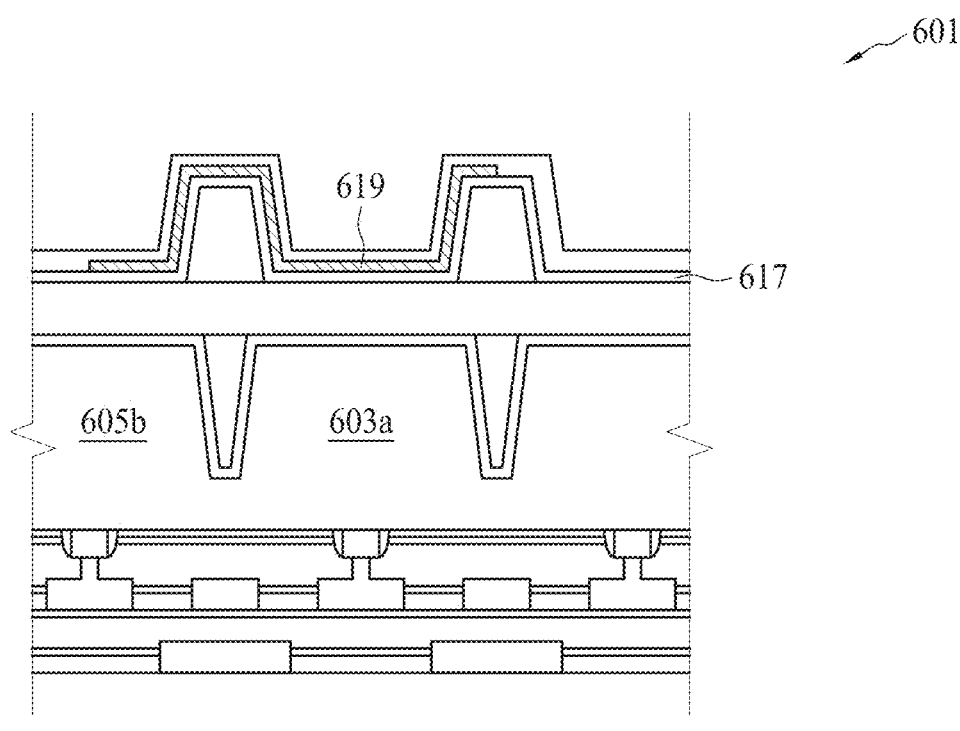
FIG. 6 illustrates a cross-sectional view of a semiconductor device according to some embodiments of the present disclosure.

FIG. 6 illustrates a cross-sectional view of a semiconductor device 601 according to some embodiments of the present disclosure. The semiconductor device 601 illustrated in FIG. 6 is similar to that illustrated in FIG. 1(a), FIG. 2(a), FIG. 3(a), and FIG. 4(a) with a difference including that the reflective layer 619 extends from a projection area of the first light sensing unit 603a to a projection area of a neighboring second light sensing unit 605b.

By disposing the reflective layer 619 extending from a projection area of the first light sensing unit 603a to a projection area of a neighboring second light sensing unit 605b, the reflective layer 619 reduces the light projected toward the second light sensing unit 605b and crosstalk generated from the first light sensing unit 603a. Nevertheless, it should be noted that embodiments of the extension of the reflective layer 619 are designed that the reduction of the light toward the second light sensing unit 605b by the reflective layer 619 does not affect the intended purpose of the second light sensing unit 605b as receiving more radiation than a first light sensing unit 603a.

Figure 7:
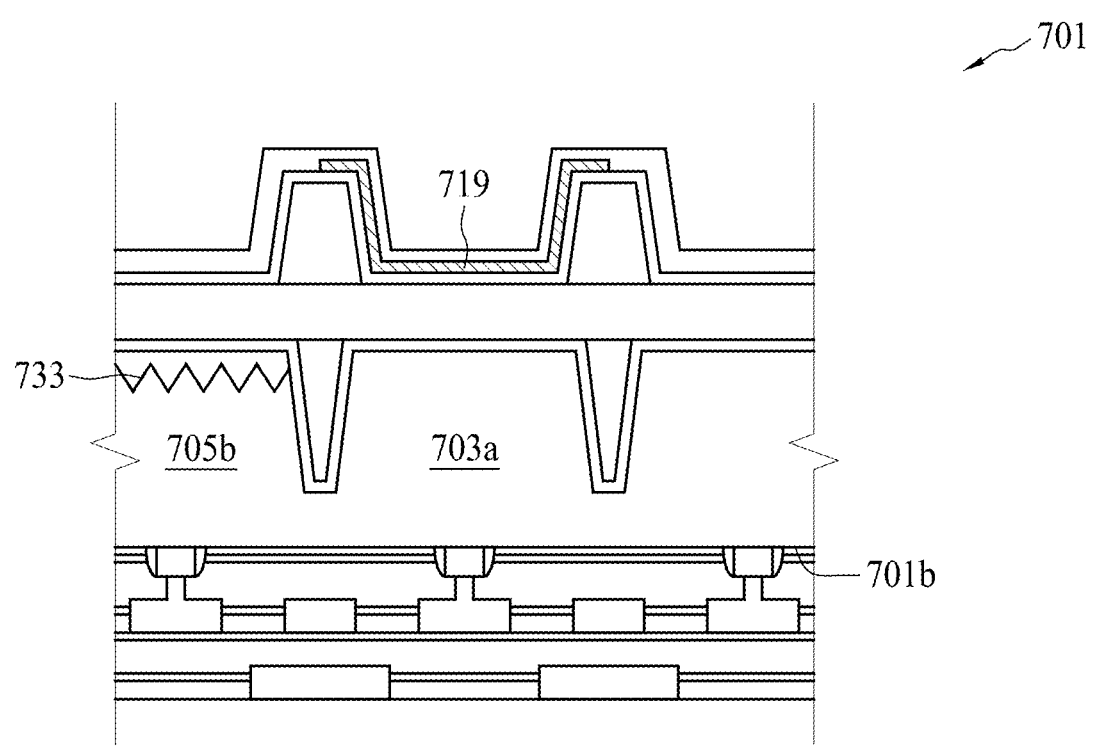
FIG. 7 illustrates a cross-sectional view of a semiconductor device according to some embodiments of the present disclosure.

FIG. 7 illustrates a cross-sectional view of a semiconductor device 701 according to some embodiments of the present disclosure. The semiconductor device 701 illustrated in FIG. 7 is similar to that illustrated in FIG. 1(a), FIG. 2(a), FIG. 3(a), and FIG. 4(a) with a difference including that a first surface 733 of a second light sensing unit 705b has roughness.

The second light sensing unit 705b has a first surface 733 facing the reflective layer 719 and a second surface 701b opposite to the first surface 733.

By disposing the first surface 733 of the second light sensing unit 705b as having roughness compared to the first surface 101a of the semiconductor device 101, less light is transmitted through the semiconductor device 701 to reach the second light sensing unit 705b because some light is refracted or reflected by the roughed first surface 733 of the second light sensing unit 705*b*. As a result, since less light reaches the second light sensing unit 705*b* because of the roughed first surface 733, less crosstalk interference is generated toward the neighboring first light sensing unit 703*a*. Therefore, the sensitivity of the neighboring first light sensing unit 703*a* increases. It should be noted that the roughness of the first surface 733 of the second light sensing unit 705*b* is so designed that the reduction of the light toward the second light sensing unit 705*b* by the roughness of the first surface 733 does not affect the intended purpose of the second light sensing unit 705*b* as receiving more radiation than a first light sensing unit 703*a*.

FIGS. 8A-8H illustrate a method of manufacturing a semiconductor device such as the semiconductor device of FIG. 2(*a*), FIG. 2(*b*), FIG. 3(*a*), and FIG. 3(*b*).

Figure 8A:
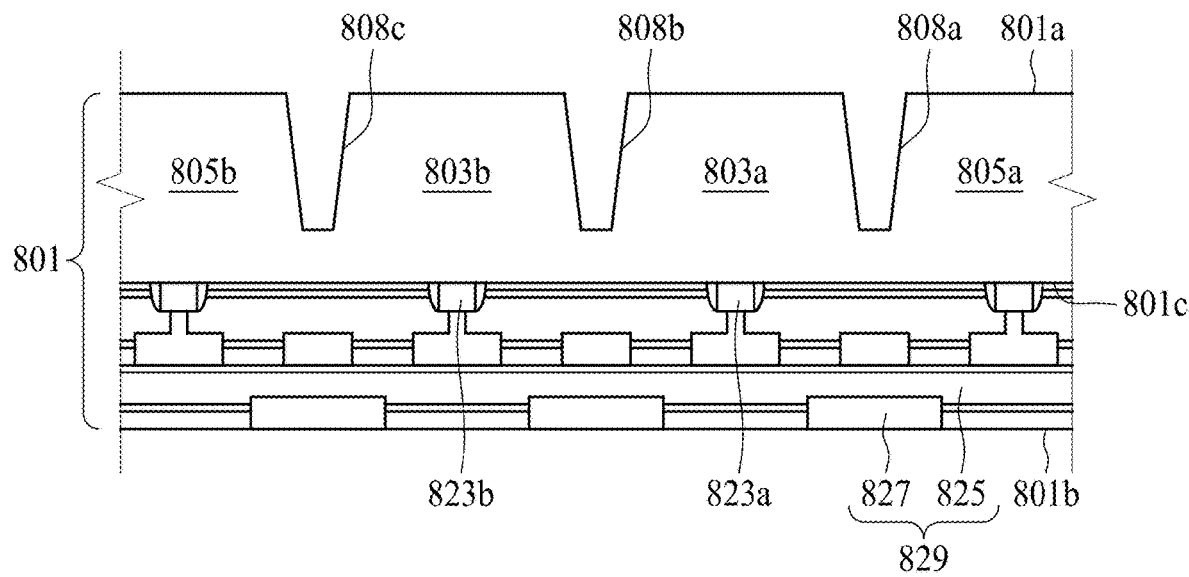
FIGS. 8A, 8B, 8C, 8D, 8E, 8F, 8G, and FIG. 8H illustrate a method of manufacturing a semiconductor device such as the semiconductor device of FIG. 2(a), FIG. 2(b), FIG. 3(a), and FIG. 3(b).

Referring to FIG. 8A, a substrate 801 is provided or received. The substrate 801 has a first surface 801*a* and a second surface 801*b* opposite to the first surface 801*a*. In some embodiments, the substrate 801 is a bulk semiconductor substrate (e.g., a bulk silicon (Si) substrate), a silicon-on-insulator (SOI) substrate, or a wafer. In some embodiments, the substrate 801 is a wafer.

The substrate 801 includes a plurality of first light sensing units 803*a*, 803*b* and a plurality of second light sensing units 805*a*, 805*b* arranged in a sub-array adjacent to the first surface 801*a* of the substrate 801. The first light sensing units 803*a*, 803*b* and the second light sensing units 805*a*, 805*b* are so disposed that at least a portion of the first light sensing unit 803*a* is adjacent to at least one first light sensing unit 803*b*. In some embodiments, the first light sensing units 803*a*, 803*b* are different from the second light sensing units 805*a*, 805*b* in that a surface of the second light sensing units 805*a*, 805*b* is roughened.

A logic device 823*a*, 823*b*, such as a transistor, may be further disposed to a third surface 801*c* opposite to the first surface 801*a* of the substrate 801. The logic device 823*a*, 823*b* is operable to enable readout of the first light sensing unit 803*a*, 803*b*, the second light sensing unit 805*a*, 805*b*, or both. In some embodiments, the logic device 823*a*, 823*b* is disposed adjacent to the first light sensing unit 803*a*, 803*b*, the second light sensing unit 805*a*, 805*b*, or both. In some embodiments, the logic device 823*a*, 823*b* is disposed adjacent to a third surface 801*c* opposite to the first surface 801*a* of the substrate 801 and close to the back end of the first light sensing unit 803*a*, 803*b* and the second light sensing unit 805*a*, 805*b*.

A circuit stack 829 may be further disposed adjacent to the logic device 823*a*, 823*b*. The circuit stack 829 may be disposed adjacent to the second surface 801*b* of the substrate 801. In some embodiments, the circuit stack 829 is a back-end-of-line (BEOL) metallization stack. According to some embodiments, circuit stack 829 electrically connects to the logic device 823*a*, 823*b* through at least one conductive via, at least one conductive contact, or a combination thereof. In some embodiments, the circuit stack 829 includes at least one metal layer 827 and at least one dielectric layer 825.

Still referring to FIG. 8A, a trench 808*c*, 808*b*, 808*a*, may be disposed between the first light sensing unit 803*a* and the second light sensing unit 805*a*, the first light sensing unit 803*a* and the first light sensing unit 803*b*, and the first light sensing unit 803*b* and the second light sensing unit 805*b*. In some embodiments, trenches 808*c*, 808*b*, 808*a* have a substantially rectangular shape, a trapezoidal shape, an elongated elliptical shape, or any other suitable shape.

In some embodiments, trenches 808*c*, 808*b*, 808*a* are formed by an etching technology, a drilling technology (e.g., a mechanical or laser drilling technology), or any suitable technologies applied from the first surface 801*a* of the substrate 801 toward the second surface 801*b* of the substrate 801.

Figure 8B:
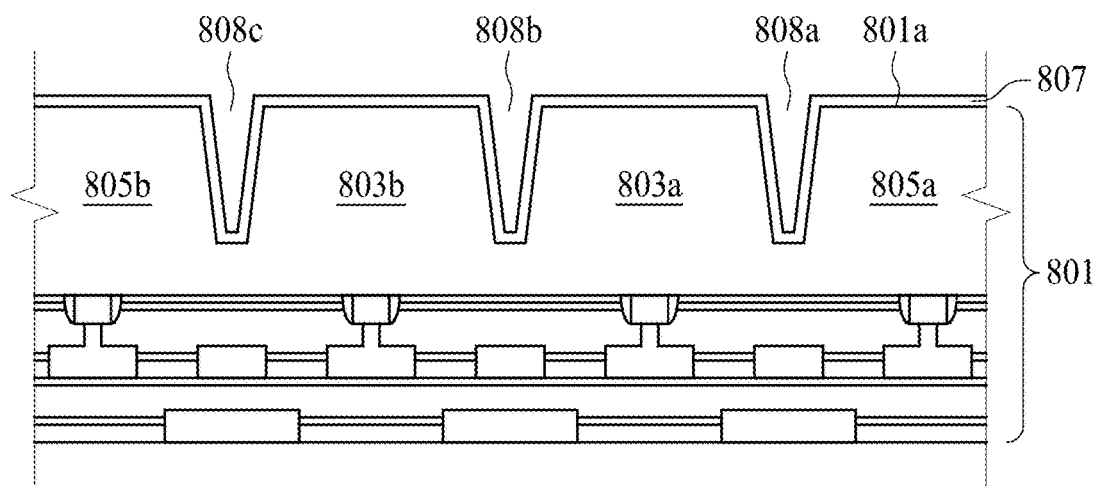

Referring to FIG. 8B, a liner 807 is disposed adjacent to the first surface 801*a* of the substrate 801. The liner 807 is disposed in conformity with the shape of the trench 808*c*, 808*b*, 808*a* of the substrate 801. In some embodiments, the liner 807 is formed by an atomic layer deposition (ALD) technology, a chemical vapor deposition (CVD) technology, or any suitable technologies.

Figure 8C:
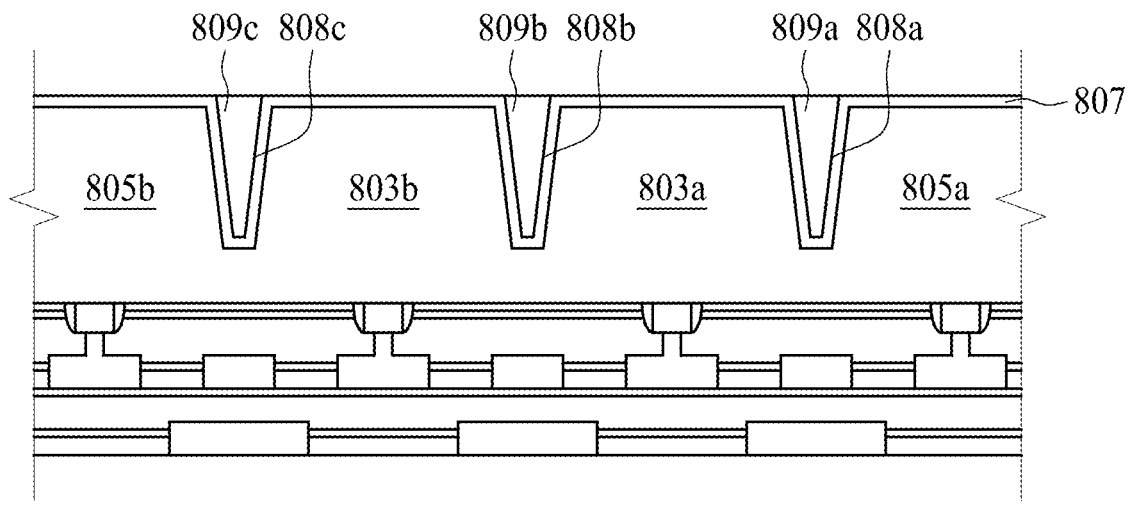

Referring to FIG. 8C, an insulating structure 809*a*, 809*b*, 809*c* is disposed adjacent to the liner 807. In some embodiments, the insulating structure 809*a*, 809*b*, 809*c* fills the trench 808*c*, 808*b*, 808*a* of the substrate 801. In some embodiments, the insulating structures 809*a*, 809*b*, 809*c* are disposed by an atomic layer deposition (ALD) technology, a chemical vapor deposition (CVD) technology, or any suitable technologies.

Figure 8D:
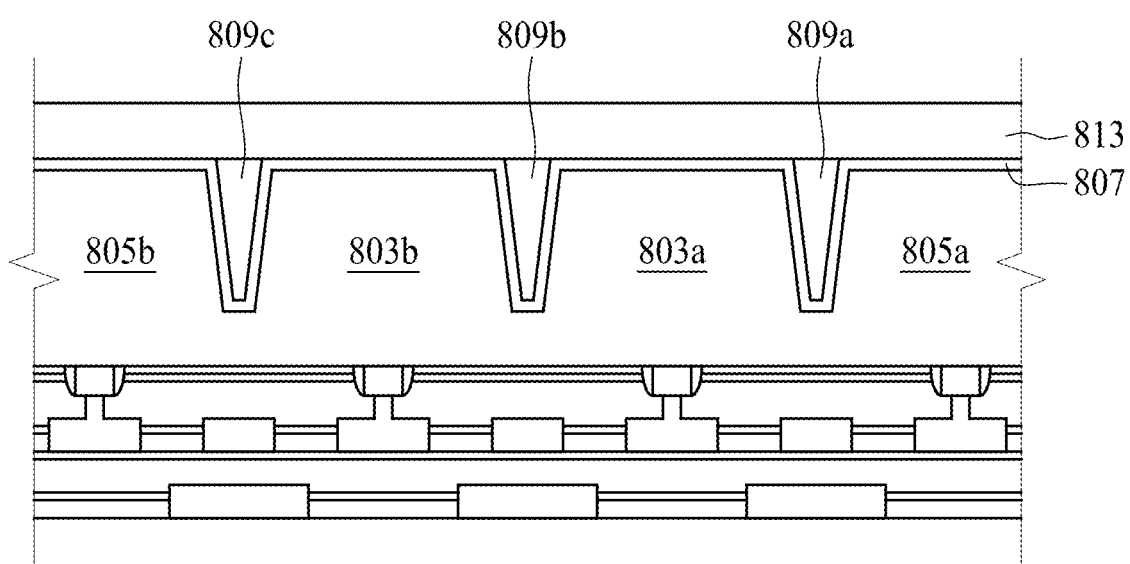

Referring to FIG. 8D, a first dielectric layer 813 is disposed adjacent to the liner 807. In some embodiments, the first dielectric layer 813 is disposed on the liner 807 and the insulating structure 809*a*, 809*b*, 809*c*. In some embodiments, the first dielectric layer 813 is disposed by an atomic layer deposition (ALD) technology, a chemical vapor deposition (CVD) technology, or any suitable technologies.

Figure 8E:
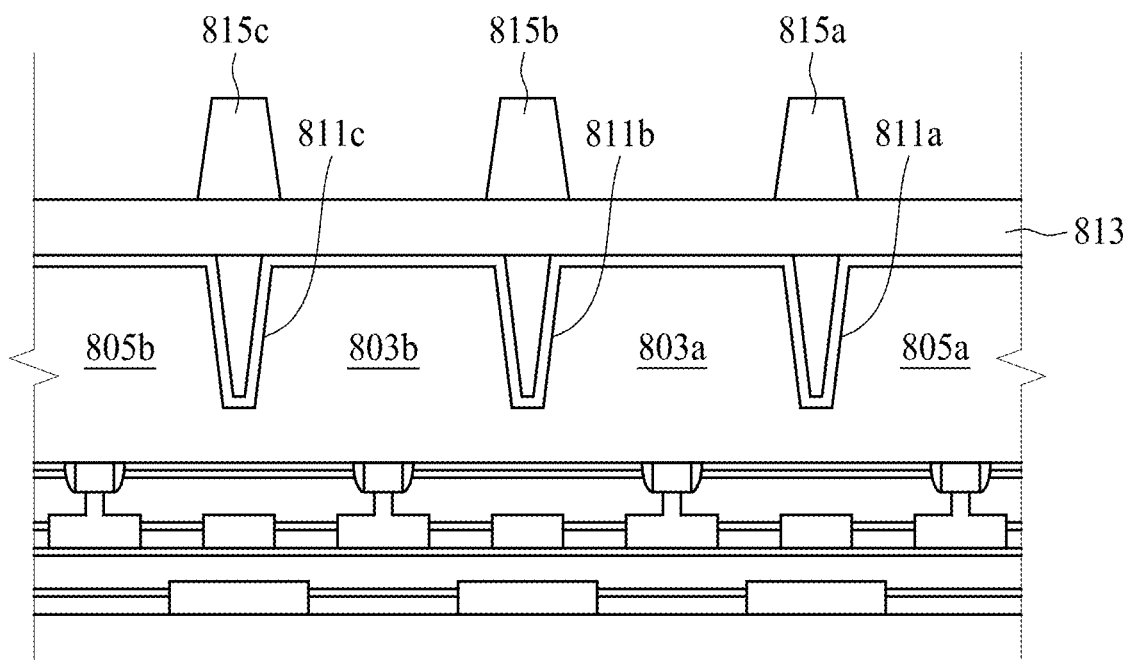

Referring to FIG. 8E, a metal layer 815*a*, 815*b*, 815*c* is disposed adjacent to the first dielectric layer 813. In some embodiments, the metal layers 815*a*, 815*b*, 815*c* are disposed corresponding to the portions of the first isolation structure 811*a*, 811*b*, 811*c*. In some embodiments, the metal layers 815*a*, 815*b*, 815*c* are formed by a technology selected from a plating technology, a photolithography technology, a polishing technology, and an etching technology.

Figure 8F:
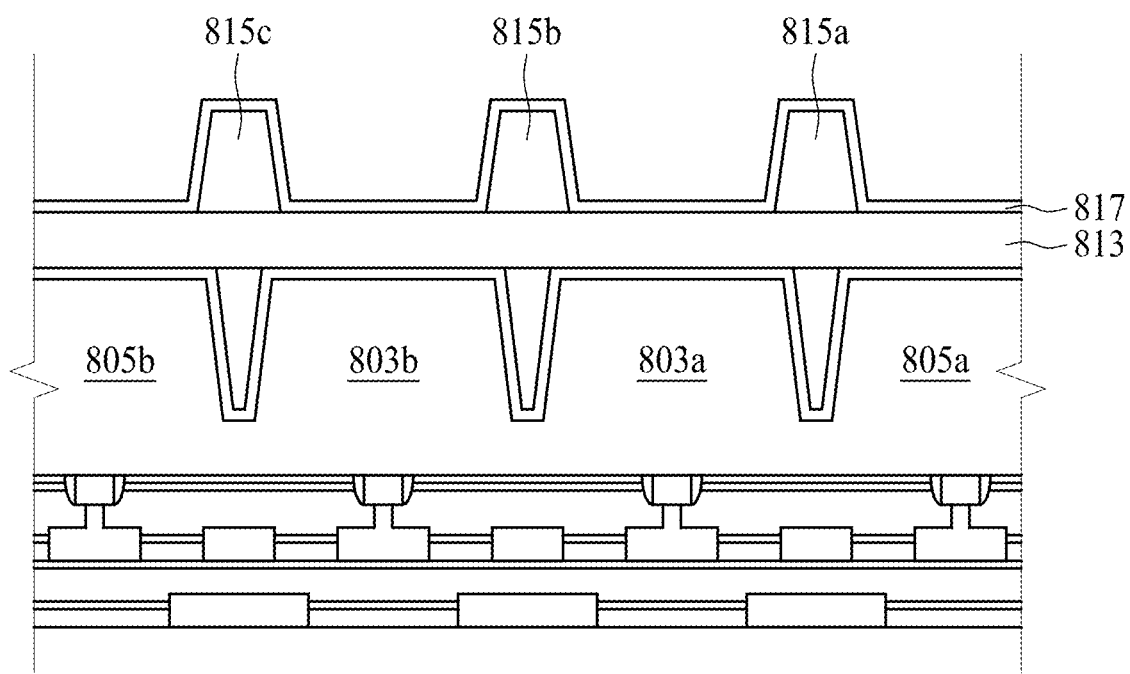

Referring to FIG. 8F, a second dielectric layer 817 is disposed adjacent to the first dielectric layer 813. In some embodiments, the second dielectric layer 817 is disposed on the metal layer 815*a*, 815*b*, 815*c* and the first dielectric layer 813. In some embodiments, the second dielectric layer 817 is disposed by an atomic layer deposition (ALD) technology, a chemical vapor deposition (CVD) technology, or any suitable technologies.

Figure 8G:
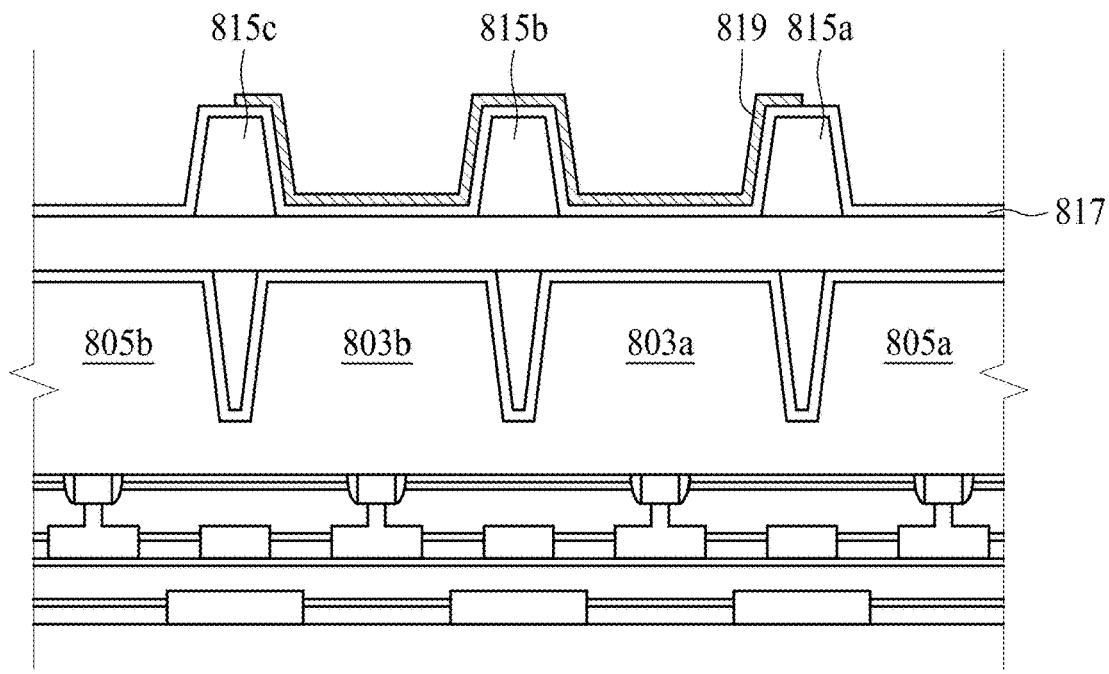

Referring to FIG. 8G, a reflective layer 819 is disposed adjacent to the second dielectric layer 817. The reflective layer 819 is disposed at a position corresponding to the first light sensing units 803*a*, 803*b*, which defines the area of the first light sensing units 803*a*, 803*b*. In some embodiments, the reflective layer 819 is disposed by a technology selected from a plating technology, a photolithography technology, a polishing technology, and an etching technology.

Figure 8H:
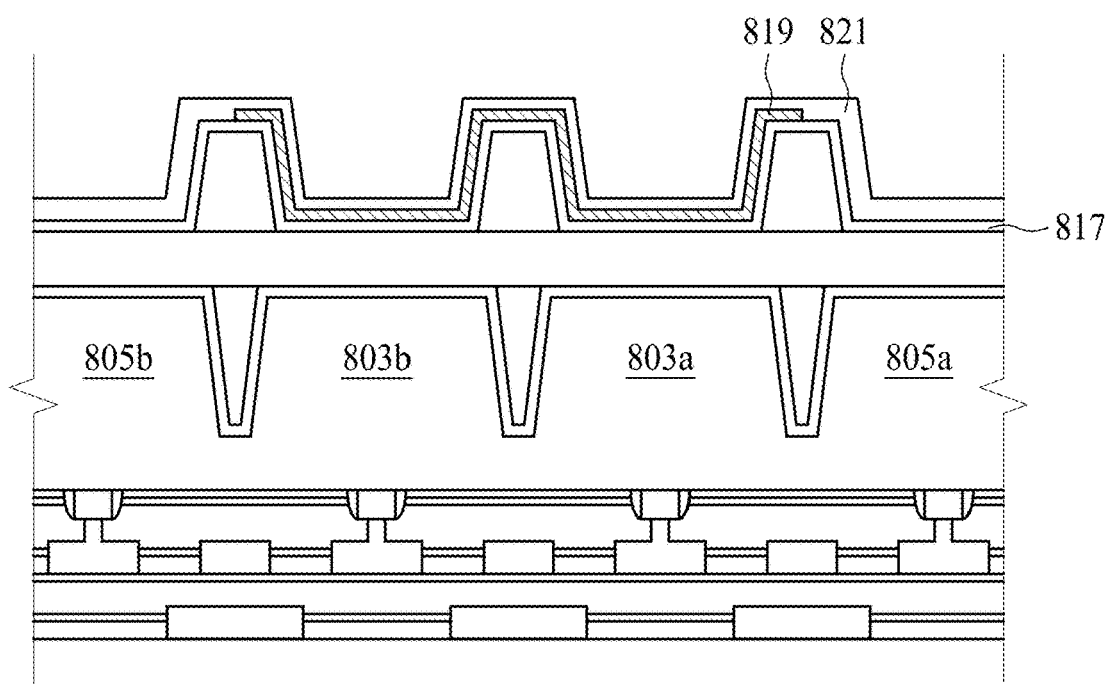

Referring to FIG. 8H, a third dielectric layer 821 is disposed adjacent to the second dielectric layer 817. In some embodiments, the third dielectric layer 821 is disposed over the reflective layer 819 and the second dielectric layer 817. In some embodiments, the third dielectric layer 821 is disposed by an atomic layer deposition (ALD) technology, a chemical vapor deposition (CVD) technology, or any suitable technologies. Subsequently, a semiconductor device, such as the one illustrated in FIG. 2(*b*) and FIG. 3(*b*) are obtained.

In some embodiments, a singularizing process is further performed on the semiconductor device obtained from the process mentioned above to obtain an image sensor including at least one pixel sensor including a first light sensing unit 803*a* and a second light sensing unit 805*a* arranged in a sub-array with the first light sensing unit 803a, where at least a portion of the first light sensing unit 803a is adjacent to at least one first light sensing unit 803b of another pixel sensor.

In some embodiments, a semiconductor device is provided. The semiconductor device includes a plurality of first light sensing units and a plurality of second light sensing units arranged in a sub-array with the first light sensing units, where the first light sensing unit refers to a light sensing unit that is operable to receive less radiation compared to the second light sensing unit and at least a portion of the first light sensing unit is adjacent to at least one first light sensing unit.

In some embodiments, a semiconductor image sensor is provided. The semiconductor image sensor includes a pixel sensor comprising a first light sensing unit and a second light sensing unit arranged in a sub-array with the first light sensing unit, where the first light sensing unit refers to a light sensing unit that is operable to receive less radiation compared to a second light sensing unit and at least a portion of the first light sensing unit is adjacent to at least one first light sensing unit of another pixel sensor.

In some embodiments, a method of manufacturing a semiconductor device is provided. The method includes: providing a substrate having a first surface and a second surface opposite to the first surface; disposing a plurality of first light sensing units and a plurality of second light sensing units arranged in a sub-array adjacent to the first surface of the substrate, where the first light sensing unit refers to a light sensing unit that is operable to receive less radiation compared to a second light sensing unit and at least a portion of the first light sensing unit is adjacent to at least one first light sensing unit; disposing a first isolation structure between the first light sensing unit and the second light sensing unit and a second isolation structure disposed between the adjacent first light sensing units; and disposing a reflective layer above the first light sensing unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of a first type of light sensing units, wherein each of the plurality of the first type of light sensing units is operable to receive a first amount of radiation; and
a plurality of a second type of light sensing units, wherein each of the plurality of the second type of light sensing units is operable to receive a second amount of radiation, and the plurality of the second type of light sensing units is arranged in an array with the plurality of the first type of light sensing units to form a pixel sensor, wherein
the first amount of radiation is smaller than the second amount of radiation, and
a first instance of the first type of light sensing unit of the plurality of the first type of light sensing units and a second instance of the first type of light sensing unit of the plurality of light sensing units are both directly between a first instance of the second type of light sensing unit of the plurality of second type of light sensing units and a second instance of the second type of light sensing unit of the plurality of second type of light sensing units, wherein the second instance of the second type of light sensing unit is a closest of the plurality of second type of light sensing units to the first instance of the second type of light sensing unit.

2. The semiconductor device of claim 1, wherein
a first portion of the first instance of the first type of light sensing unit is surrounded by a first second light sensing unit of the plurality of the second type of light sensing units, and
a second portion of the first instance of the first type of light sensing unit is surrounded by the second instance of the first type of light sensing unit, and
the first portion is not greater than the second portion.

3. The semiconductor device of claim 1, wherein the plurality of the second type of light sensing units is a circular region surrounded by the plurality of the first type of light sensing units.

4. The semiconductor device of claim 1, further comprising a reflective layer above the plurality of the first type of light sensing units.

5. The semiconductor device of claim 4, wherein the reflective layer extends from a projection area of one of the plurality of the first type of light sensing units to a projection area of one of the plurality of the second type of light sensing units.

6. The semiconductor device of claim 1, further comprising:
a first isolation structure between one of the plurality of the first type of light sensing units and one of the plurality of the second type of light sensing units; and
a second isolation structure between adjacent first type of light sensing units of the plurality of the first type of light sensing units, wherein the first isolation structure has a larger projection area than the second isolation structure.

7. The semiconductor device of claim 1, further comprising a third type of light sensing unit between one of the plurality of the first type of light sensing units and one of the plurality of the second type of light sensing units, wherein the third type of light sensing unit is operable to receive less radiation than the first amount of radiation or the second amount of radiation.

8. A semiconductor image sensor, comprising:
an array of pixel sensors, wherein the array of pixel sensors comprises a first pixel sensor and a second pixel sensor, and the first pixel sensor comprises:
a first type of light sensing unit; and
a second type of light sensing unit, wherein the first type of light sensing unit and the second type of light sensing unit are arranged in a sub-array, wherein
the first type of light sensing unit is operable to receive less radiation than the second type of light sensing unit, and
at least a portion of the first type of light sensing unit is adjacent to the second pixel sensor;
a metal layer over the first pixel sensor and the second pixel sensor, wherein the metal layer is between the first type of light sensing unit and the second type of light sensing unit in a plan view; and
a reflective layer overlapping the metal layer and the first type of light sensing unit.

9. The semiconductor image sensor of claim 8, wherein a first portion of the first type of light sensing unit is surrounded by the second type of light sensing unit, a second portion of the first type of light sensing unit is surrounded by another first type of light sensing unit of another pixel sensor of the array of pixel sensors, and the first portion is not greater than the second portion.

10. The semiconductor image sensor of claim 8, wherein a first instance of the first type of light sensing unit is adjoined at a first side by a second instance of the first type of light sensing unit, and at a second side adjacent to the first side by a third first type of light sensing unit.

11. The semiconductor image sensor of claim 8, wherein the second type of light sensing unit is curved.

12. The semiconductor image sensor of claim 8, wherein the reflective layer extends from a projection area of the first type of light sensing unit to a projection area of the second type of light sensing unit.

13. The semiconductor image sensor of claim 8, wherein the first type of light sensing unit is located at a corner of the first pixel sensor.

14. The semiconductor image sensor of claim 8, further comprising:
   a first isolation structure between the first type of light sensing unit and the second type of light sensing unit; and
   a second isolation structure between an adjacent first type of light sensing units, wherein the first isolation structure has a larger projection area than the second isolation structure.

15. The semiconductor image sensor of claim 8, further comprising a third type of light sensing unit between the first type of light sensing unit and the second type of light sensing unit, wherein the third type of light sensing unit is operable to receive less radiation than the first type of light sensing unit or the second type of the light sensing unit.

16. A semiconductor device, comprising:
   a first light senor configured to receive a first amount of radiation;
   a second light sensor configured to receive a second amount of radiation different from the first amount of radiation, wherein the second light sensor comprises a single light sensing unit; and
   a third light sensor configured to receive a third amount of radiation different from each of the first amount of radiation and the second amount of radiation, wherein the second light sensor is between the third light sensor and the first light sensor, the second light sensor is in continuous direct contact with the first light sensor along multiple sides of the first light sensor, and the first light sensor, the second light sensor and the third light sensor collectively form a pixel sensor.

17. The semiconductor device of claim 16, further comprising a reflective layer over the first light sensor, wherein the reflective fails to cover the second light sensor and the third light sensor.

18. The semiconductor device of claim 16, wherein the first amount of radiation is greater than each of the second amount of radiation and the third amount of radiation.

19. The semiconductor device of claim 16, further comprising:
   a fourth light sensor configured to receive the first amount of radiation;
   a fifth light sensor configured to receive the second amount of radiation; and
   a sixth light sensor configured to receive the third amount of radiation, wherein the fifth light sensor is between the sixth light sensor and the fourth light sensor, and the fourth light sensor, the fifth light sensor and the sixth light sensor collectively form a second pixel sensor.

20. The semiconductor device of claim 19, wherein the second light sensor comprises a first portion and a second portion, the fourth light sensor is between the first portion and the fifth light sensor, and the second portion is adjacent to the fifth light sensor.

* * * * *